United States Patent

Matsumura et al.

(10) Patent No.: US 10,436,846 B2
(45) Date of Patent: Oct. 8, 2019

(54) SYSTEMS AND METHODS FOR BATTERY CAPACITY ESTIMATION

(71) Applicant: INTEL CORPORATION, Santa Clara, CA (US)

(72) Inventors: Naoki Matsumura, San Jose, CA (US); Andrew W. Keates, Los Gatos, CA (US)

(73) Assignee: INTEL CORPORATION, Santa Clara, CA (US)

( * ) Notice: Subject to any disclaimer, the term of this patent is extended or adjusted under 35 U.S.C. 154(b) by 380 days.

(21) Appl. No.: 14/977,127

(22) Filed: Dec. 21, 2015

(65) Prior Publication Data

US 2017/0176538 A1    Jun. 22, 2017

(51) Int. Cl.
  *G01R 31/36* (2019.01)
  *H02J 7/00* (2006.01)
  *G01R 31/367* (2019.01)
  *G01R 31/3835* (2019.01)

(52) U.S. Cl.
  CPC ....... *G01R 31/367* (2019.01); *G01R 31/3835* (2019.01); *H02J 7/0047* (2013.01); *H02J 7/0052* (2013.01); *H02J 2007/005* (2013.01)

(58) Field of Classification Search
  CPC .............. G01R 31/3651; G01R 31/362; G01R 31/3631; H02J 7/0047; H02J 7/0052; H02J 7/005
  USPC ........................................................ 702/63
  See application file for complete search history.

(56) References Cited

U.S. PATENT DOCUMENTS

| | | | |
|---|---|---|---|
| 9,653,759 B2 * | 5/2017 | Coates | H01M 10/42 |
| 2005/0237024 A1 | 10/2005 | Hogari et al. | |
| 2008/0116853 A1 | 5/2008 | Du | |
| 2010/0102836 A1 | 4/2010 | Lee et al. | |
| 2012/0105013 A1 | 5/2012 | Lin et al. | |
| 2013/0260188 A1 * | 10/2013 | Coates | H01M 10/42 |
| | | | 429/50 |
| 2016/0190833 A1 * | 6/2016 | Roumi | H02J 7/0021 |
| | | | 320/136 |

FOREIGN PATENT DOCUMENTS

JP    2005080376 A    3/2005

OTHER PUBLICATIONS

PCT/US2016/059405, International Search Report and Written Opinion, dated Feb. 14, 2017, 12 pages.

* cited by examiner

*Primary Examiner* — Gene N Auduong
(74) *Attorney, Agent, or Firm* — Stoel Rives LLP

(57) ABSTRACT

Systems and methods are disclosed for estimating a full-charge battery cell capacity without a coulomb counting device. First and second measured voltages of the battery cell are measured during a charging or discharging period. The first and second measured voltages of the battery cell are converted to percentages of remaining battery life. The amount of charge delivered to the battery cell and/or delivered from the battery cell during charging/discharging is calculated. The change in the percentage of remaining battery life is compared to the amount of charge delivered to the battery cell and/or delivered from the battery cell to calculate various battery cell evaluation calculations, including a full-charge battery cell capacity.

25 Claims, 8 Drawing Sheets

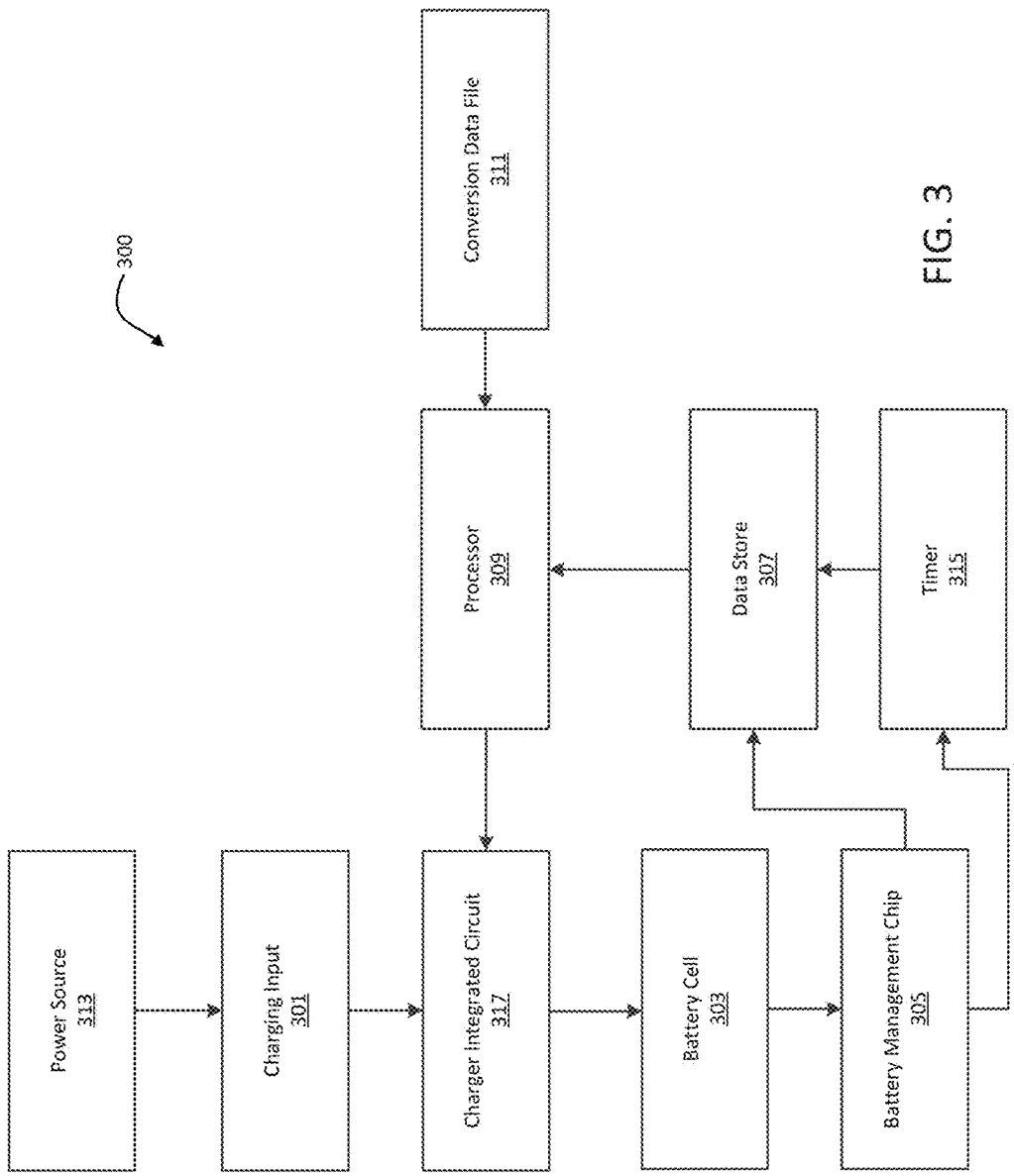

SYSTEMS AND METHODS FOR BATTERY CAPACITY ESTIMATION

TECHNICAL FIELD

This disclosure relates to portable energy sources such as batteries, and more particularly to methods and systems for calculating an energy capacity of the portable energy source.

BACKGROUND

Battery cells degrade over time such that the energy capacity of the battery cell decreases. Many electronic devices attempt to monitor a battery cell and communicate its remaining energy capacity to a user. In some electronic devices, the battery cell's energy capacity is only measured in percentage of remaining charge. In other electronic devices, the battery cell's energy capacity is measured by a coulomb counter (voltameter or coulometer). Coulomb counters may add cost, complexity, and current draw to a device.

BRIEF DESCRIPTION OF THE DRAWINGS

Arrangements and embodiments may be described in detail with reference to the following drawings, in which like reference numerals refer to like elements, and wherein:

FIG. 3 illustrates another embodiment of a system for battery cell capacity estimation according to one embodiment;

DETAILED DESCRIPTION OF EMBODIMENTS

Figure 1:
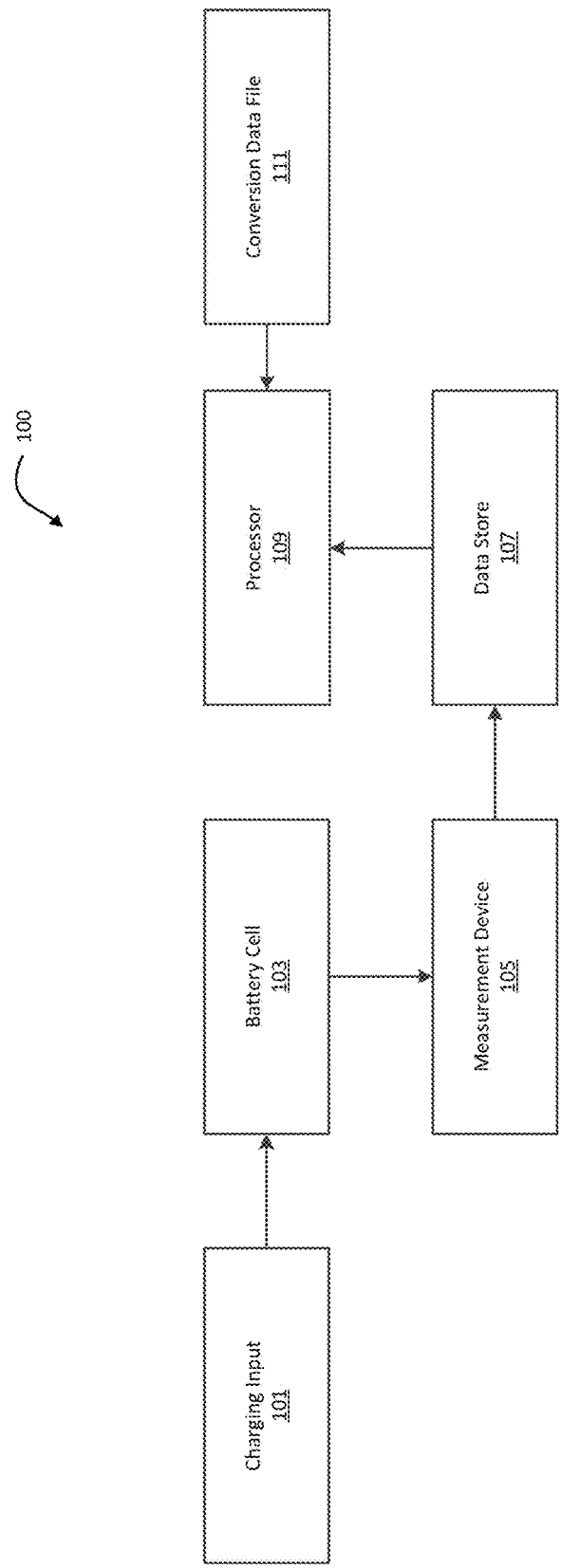
FIG. 1 illustrates a system for battery cell capacity estimation according to one embodiment.

Embodiments and arrangements disclosed herein include one or more portable energy sources or "battery cells." In certain embodiments, a system is used to calculate a full-charge capacity in units of energy of a battery without a coulomb counter. In some embodiments, the units of energy comprise one or more of coulombs, mAh, or other suitable units measuring energy or electric charge. In some embodiments, a unit of energy (or charge capacity) may be converted to Watt Hours (Wh) by multiplying an amount of energy in Ah by a battery nominal voltage. A remaining time may be calculated by dividing the calculated amount of Wh by a system power consumption. As discussed below, some embodiments calculate full-charge capacity for a battery cell after measuring a present voltage reading of the battery multiple times during charging. In some embodiments, for example, a first voltage is measured during charging and a second voltage is measured during charging, and the voltages are converted to percentages of presently remaining battery cell capacity. In some of these embodiments, the total amount of charge delivered during charging is calculated as the time between measurements multiplied by the average current delivered to the battery cell during charging between the times of the first and second measurements. The full-charge capacity may be calculated by dividing the total amount of charge delivered to the battery cell by the difference in percentage charge between the first voltage and the second voltage expressed as a decimal.

Using similar processes, further calculations may be made, such as present charge level in coulombs, mAh, or other suitable units measuring energy or electric charge; a remaining run time for the device; a remaining charge time for the device; and battery degradation rate. Calculating a full-charge energy capacity in units of energy of a battery may be useful to predict a remaining run time of a device. It may also be beneficial by allowing a reduction in charge current proportional to a measured reduction of full-charge energy capacity, thus improving a cycle life of a battery.

For simplicity and clarity of illustration, the drawing figures illustrate the general manner of construction, and descriptions and details of well-known features and techniques may be omitted to avoid unnecessarily obscuring the discussion of the described embodiments. Additionally, elements in the drawing figures are not necessarily drawn to scale. For example, the dimensions of some of the elements in the figures may be exaggerated relative to other elements to help improve understanding of the disclosed embodiments. The same reference numerals in different figures denote the same elements, while similar reference numerals may, but do not necessarily, denote similar elements.

The term "processor" may comprise one or more processors. The terms "first," "second," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted, and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus. Occurrences of the phrase "one embodiment" herein do not necessarily all refer to the same embodiment.

FIG. 1 illustrates a system 100 for battery cell capacity estimation including a charging input 101, a battery cell 103, a measurement device 105, a data store 107, a processor 109, and a conversion data file 111. The charging input 101 may comprise a port for connecting the battery cell 103 to a charging current from a power supply. In some embodiments, the charging current delivered to the battery cell 103 is constant. In other embodiments, the charging current is variable, with a calculable average charging current. The charging current may be delivered through the charging input 101 to the battery cell 103 for charging (or recharging).

In other embodiments, the charging input 101 may be in parallel with, or a probe (such as an ammeter) of, a current carrier. In some embodiments, the battery cell 103 comprises a rechargeable battery comprising one of a lithium-ion battery, a lithium-ion polymer battery, a lead-acid battery, a nickel-cadmium battery, a nickel-metal hydride battery, and a silver-zinc battery. However, it is understood that the battery cell 103 may comprise any type of rechargeable battery.

The measurement device 105 is configured to read a voltage of the battery cell 103 at various times. In some embodiments, the measurement device 105 comprises a voltmeter that probes the battery cell 103 during a charging period to read a first measured voltage and a second measured voltage of the battery cell 103. In other embodiments, the charging current is temporarily stopped during charging to allow the measurement device 105 to measure the first measured voltage and temporarily stopped again to measure the second measured voltage under open circuit conditions. Data related to the first measured voltage and the second measured voltage may be stored in the data store 107. The data store 107 may store additional data related to the first measured voltage and the second measured voltage, including, but not limited to, a time associated with the measurement, an elapsed time between measurements, and whether a voltage was measured under open circuit conditions.

The processor 109 may access a non-transitory computer-readable storage medium comprising instructions for execution by the processor 109 to access the first measured voltage and the second measured voltage in the data store 107 and use the conversion data file 111 to convert the first measured voltage into a first percentage of battery cell capacity (first percentage) and to convert the second measured voltage into a second percentage of battery cell capacity (second percentage). In some embodiments, the conversion data file 111 may comprise one or more of a conversion table and a mathematical formula for calculating a percentage of remaining battery cell charge from a measured voltage. In some embodiments, the conversion data file 111 may be comprised in firmware of a system on a chip, electronic storage media, or the data store 107.

The processor 109 may also access data comprising the total amount of energy delivered from the power source to the battery cell 103 during the elapsed time between measuring the first measured voltage and the second measured voltage. In other embodiments, the processor 109 may access data comprising one of a calculation of average current or a measurement of a constant current (also average current) delivered to the battery cell 103 during the elapsed time between measuring the first measured voltage and the second measured voltage. In these embodiments, the processor 109 may calculate a total amount of energy delivered to the battery cell 103 during the elapsed time by using a formula comprising multiplying the amount of elapsed time by one of the average current or measured constant current. The processor 109 may use the total amount of energy delivered to the battery cell 103 and the difference between the second percentage and the first percentage to calculate or estimate a full-charge battery cell capacity. In some embodiments, the calculation comprises the formula: $C=100/(P_2-P_1)\times T\times I$, wherein C is the full-charge battery cell capacity, $P_2$ is the second percentage, $P_1$ is the first percentage, T is the elapsed time, and I is the average current delivered to the battery cell 103 during the elapsed time.

Other battery evaluation calculations may be made using similar principles to those described for calculating the full-charge battery cell capacity. For example, formulas may be used to calculate an estimated amount of time remaining until the battery cell 103 is 80% charged. In some embodiments, a formula for calculating an estimated amount of time remaining until the battery cell 103 is 80% charged may be: $T_R=(80-P_2)/(P_2-P_1)\times T_E$, wherein $T_R$ is the time remaining until the battery cell 103 is fully charged, $P_2$ is the first percentage, $P_1$ is the first percentage, and $T_E$ is the elapsed time. This is particularly effective when estimating calculating an estimated amount of time remaining until the battery cell 103 is charged to a level at which the battery is being charged with a constant current, rather than a constant voltage. An equation for calculating a present level of charge stored in the battery cell 103 may be: $C_P=P_P/(P_2-P_1)\times T\times I$, wherein $C_P$ is the present level of charge, $P_P$ is a present percentage, $P_2$ is the second percentage, $P_1$ is the first percentage, T is the elapsed time, and I is the average current. An estimated amount of time remaining to fully discharge the battery cell 103 may be calculated as $T_D=C_P/I_{out}$, where in $T_D$ is the time remaining to fully discharge the battery cell 103, $C_P$ is an estimated present level of charge, and $I_{out}$ is an average current delivered from the battery cell 103 to a device (or load) during discharge. In some embodiments, the device includes the charging input 101, the battery cell 103, the measurement device 105, the data store 107, the processor 109, and the conversion data file 111. In certain such embodiments, the device includes a portable electronic device such as a laptop, a mobile phone, a wearable electronic device, or an accessory to a portable electronic device. Examples of a wearable electronic device include a watch, an exercise device, a portable media player, and a wearable medical device.

In some of these embodiments, the first measured voltage and the second measured voltage are adjusted to compensate for a change in battery voltage induced by the charging current. In some embodiments, the battery may be delivering energy to the device. In these embodiments, the processor 109 may factor an amount of energy delivered from the battery when calculating the total amount of energy delivered to the battery during charging. This energy output may be calculated as a product of a current delivered from the battery cell 103 and the elapsed time. This accounting may be made by adding the amount of energy delivered from the battery to the device to the product of the time elapsed and the average current. An example formula for calculating full-charge battery cell capacity accounting for a power delivered from the battery cell 103 to the device is $C=100/(P_2-P_1)\times(T\times I-E_{out})$, wherein C is the full-charge battery cell capacity, $P_2$ is the second percentage, $P_1$ is the first percentage, T is the elapsed time, I is the average current delivered to the battery cell 103 during the elapsed time, and $E_{out}$ is the amount of energy, or charge, delivered from the battery cell 103 to the device. Another embodiment may use a similar formula: $C=100/(P_2-P_1)\times T\times(I_{in}-I_{out})$ wherein C is the full-charge battery cell capacity, $P_2$ is the second percentage, $P_1$ is the first percentage, T is the elapsed time, $I_{in}$ is the average current delivered to the battery cell 103 during the elapsed time, and $I_{out}$ is the average current delivered from the battery cell 103 to the device during the elapsed time.

In some embodiments, a similar calculation of full-charge battery cell capacity can be made by measuring the first measured voltage of the battery cell 103 and the second measured voltage of the battery cell 103 during a discharging period. In some of these embodiments, the first measured voltage and the second measured voltage are converted to a first percentage and a second percentage using methods discussed herein, and a total charge output is calculated. The total charge output may be calculated as the product of an elapsed time between measuring the first measured voltage and the second measured voltage and an average output current delivered from the battery cell 103 to the device. The full-charge battery cell capacity may be calculated using an equation comprising calculating an estimated battery cell full-charge capacity as: $C=100/(P_1-P_2) \times T \times I$, wherein C is the full-charge battery cell capacity, $P_2$ is the second percentage, $P_1$ is the first percentage, T is the elapsed time, and I is the average current delivered from the battery cell 103 to the device during the elapsed time. The current delivered from the battery cell 103 to the device may be measured by a device comprising an ammeter. In some embodiments, the current delivered from the battery cell 103 may be generally constant, while in other embodiments, the current may be variable. An average current may be calculated or estimated using instantaneous measurements.

Similar formulas and combinations of the formulas described herein may be used for related calculations of one or more of an estimated run time, an estimated present level of charge, and an estimated amount of time remaining to fully discharge the battery cell 103.

Figure 2:
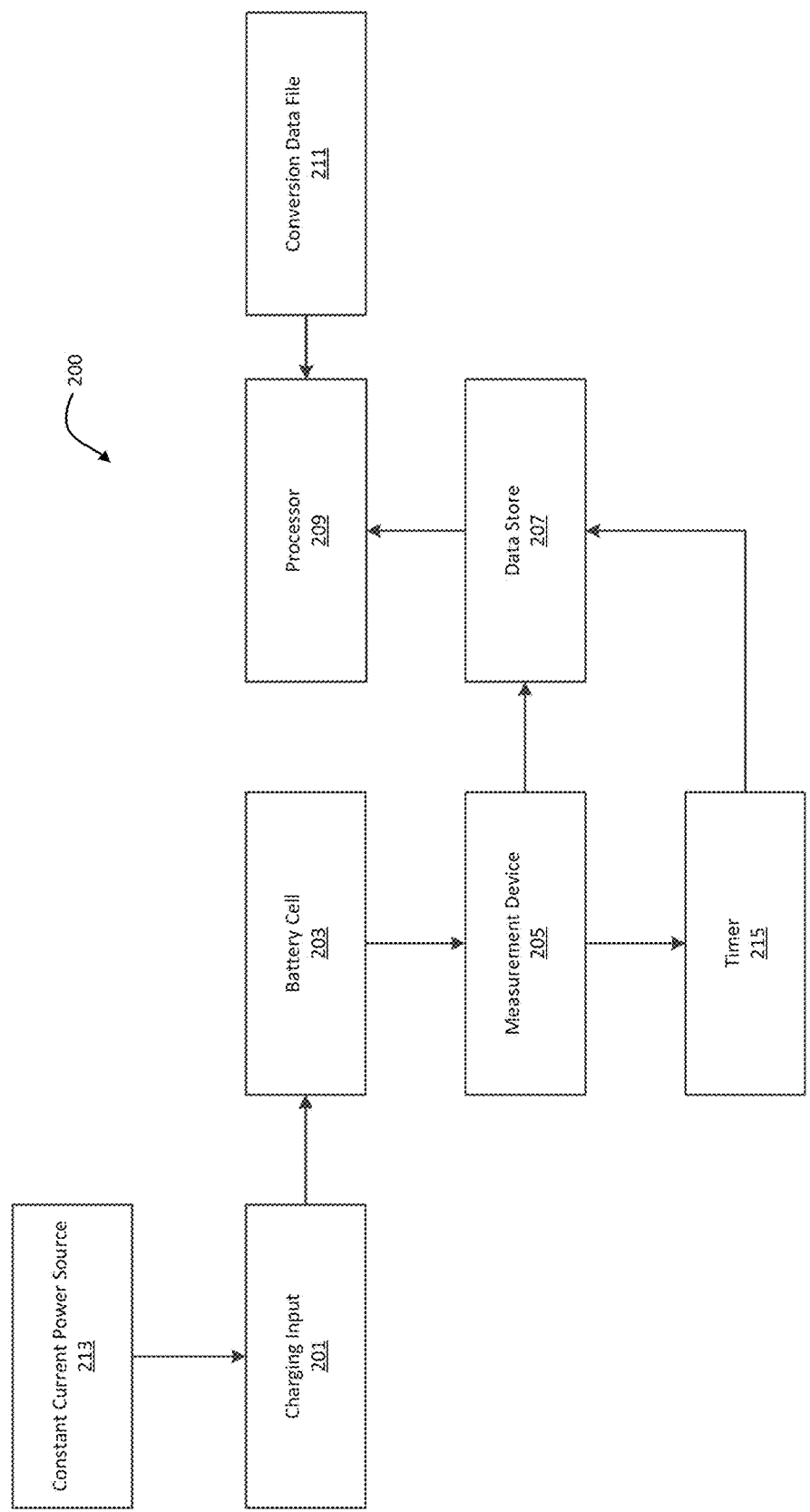
FIG. 2 illustrates another embodiment of a system for battery cell capacity estimation according to one embodiment.

FIG. 2 illustrates another embodiment of a system 200 for battery cell capacity estimation comprising a charging input 201, a battery cell 203, a measurement device 205, a data store 207, a processor 209, a conversion data file 211, a power source 213, and a timer 215. In some embodiments, the charging input 201, the battery cell 203, the measurement device 205, the data store 207, the processor 209, and the conversion data file 211 perform functions similar to those performed by elements of the embodiments described in FIG. 1. In some embodiments, the system 200 is used to make battery evaluation calculations as described herein. In addition to the elements similar to those of FIG. 1, the system 200 comprises the power source 213 and the timer 215. The power source 213 may comprise a current regulator such as a charging cable and adaptor designed for use with a particular electronic device. In some embodiments, the power source 213 comprises a transformer. In some embodiments, the current delivered to the battery cell 203 is reduced proportionally with an estimated reduction in full-charge battery cell capacity. For example, if a full-charge battery capacity is estimated at 90% of an original full-charge battery capacity, and the power source 213 delivered an original charging current of 1 A during charging, the current may be adjusted to 0.9 A. This adjustment may take place in the charging input 201 or the power source 213. Reducing the charging rate proportionally with battery degradation may increase battery life cycle. Additionally, the original charging current may be set as a maximum allowed charging current to prevent damage to the battery cell 203 if an inaccuracy in the full-charge battery cell estimation would cause an adjusted charging current to exceed the original charging current. Similarly, if an estimated amount of time remaining until the battery cell 203 is fully charged is greater than an amount of time that would remain until the battery cell 203 would be fully charged with an original full-charge battery cell capacity, the charging current may be modified by considering the estimated amount of time.

The timer 215 may measure an elapsed time between measuring a first measured voltage and a second measured voltage. In other embodiments, the timer 215 may measure a time of day from which an elapsed time between measurements may be calculated. In some embodiments, the timer 215 is triggered by the measurement device 205 measuring the voltage of the battery cell 203. The timer 215 may be comprised in the measurement device 205 or it may be an independent component of a device. In some embodiments, the timer 215 may automatically send timing data to the data store 207. The data store 207 may correlate timing data with measurements from the measurement device 205.

FIG. 3 illustrates another embodiment of a system 300 for battery cell capacity estimation comprising a charging input 301, a battery cell 303, a battery management chip 305, a data store 307, a processor 309, a conversion data file 311, a power source 313, a timer 315, and a charger integrated circuit 317. In some embodiments, the charging input 301, the battery cell 303, the data store 307, the processor 309, the conversion data file 311, the power source 313, and the timer 315 perform functions similar to those performed by elements of the embodiments described in FIG. 2. Additionally, the battery management chip 305 may perform similar functions to those of the measurement device 205 of FIG. 2. In some embodiments, the system 300 is used to make battery evaluation calculations as described herein. In addition to the elements similar to those of FIG. 2, the system 300 comprises the charger integrated circuit 317. In the illustrated embodiment, electricity (or charge) flows from the power source 313 to the charging input, then from the charging input 301 to the charger integrated circuit 317, and from the charger integrated circuit 317 to the battery cell 303. In some embodiments, the processor 309 communicates one or more battery evaluation calculations to the charger integrated circuit 317. In some embodiments, the charger integrated circuit 317 regulates the current delivered to the battery cell 303 such that the current is constant. In some embodiments, the charger integrated circuit 317 limits the amount of current delivered to the battery cell 303 in response to degradation of the battery cell full-charge capacity. For example, if the full-charge battery cell capacity of the battery cell 303 was originally 1 Ah and is estimated to have degraded to 0.9 Ah, the charger integrated circuit 317 may limit the amount of current delivered to the battery cell 303 to 90% of the amount of current delivered to the battery cell 303 before degradation. The charger integrated circuit 317 may comprise one or more of a charger integrated circuit processor and a charger integrated circuit data store. The battery management chip 305 may be comprised in a battery management system that is configured to measure one or more of voltage and current delivered from the battery to a device or load. In some embodiments, the battery management chip 305 measures the current delivered from the battery to the device or load and communicates the measurement to the processor 309 for performing the battery evaluation calculations. For example, the processor 309 may factor an amount of energy delivered from the battery cell 303 when calculating the total amount of energy delivered to the battery cell 303 during charging, in the following formula for calculating full-charge battery cell capacity: $C=100/(P_2-P_1) \times (T \times I - E_{out})$, wherein C is the full-charge battery cell capacity, $P_2$ is the second percentage, $P_1$ is the first percentage, T is the elapsed time, I is the average current delivered to the battery cell 303 during the elapsed time, and $E_{out}$ is the amount of energy, or charge, delivered from the battery cell 303 to the device.

Figure 4A:
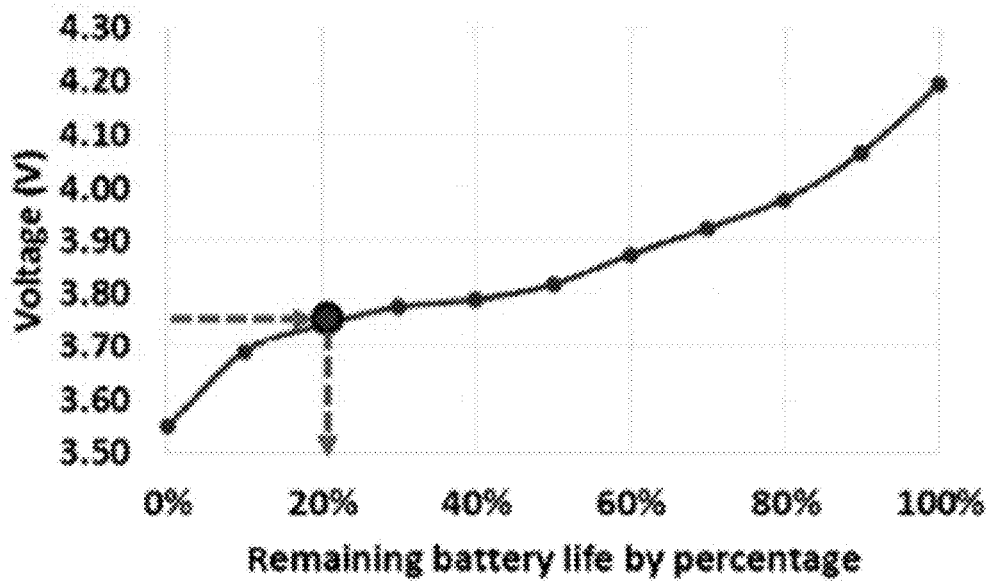
FIG. 4A is a graph illustrating an example conversion data file according to one embodiment.
Figure 4B:
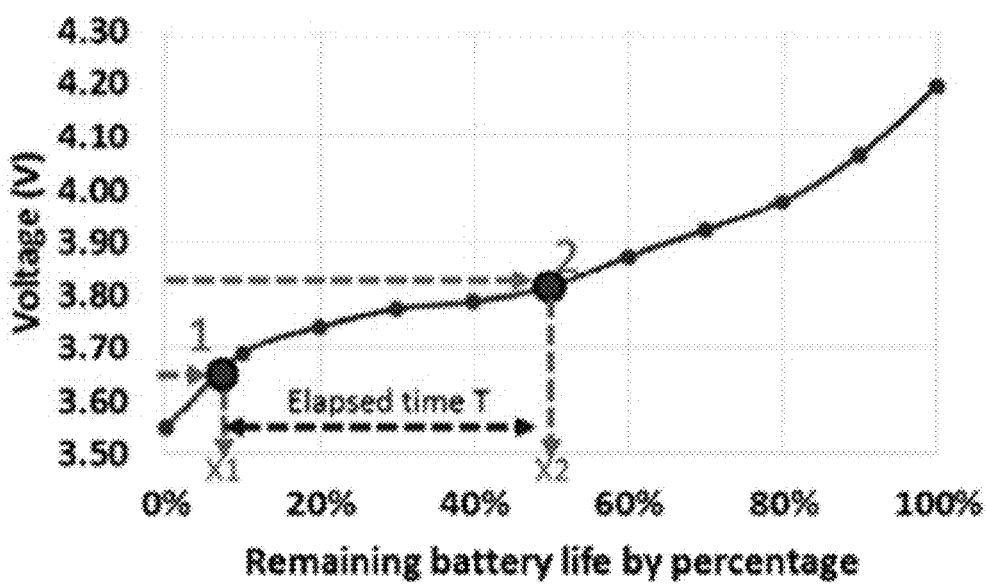
FIG. 4B is another graph illustrating an example conversion data file according to one embodiment.

FIG. 4A is a graph illustrating an example conversion data file. The vertical axis represents a measured voltage of a battery. The horizontal axis represents a remaining battery life by percentage. The conversion data file may comprise a formula for generating a graph like the one shown. Alternatively, the conversion data file may comprise a chart for generating a graph like the one shown. As illustrated in FIG. 4A, a measurement of about 3.75 volts is measured at a battery cell. The graph, or underlying data, can be used to convert the 3.75 volt measurement to about 21% of battery life remaining. Each type of battery cell may have its own known conversion formula, chart, and/or graph for converting voltage to a remaining battery life by percentage. FIG. 4B illustrates measuring a voltage at two times (1 and 2). As illustrated, if measurement 1 occurred before measurement 2, a battery cell has been charging during an elapsed time between measuring 1 and measuring 2. Alternatively, if measurement 2 occurred before measurement 1, the battery cell has been discharging between measuring 2 and measuring 1. As illustrated, a time between measurements may be measured to be used in calculating the amount of charge delivered to the battery cell between measuring 1 and measuring 2, or alternatively, for calculating the amount of charge delivered from the battery cell between measuring 2 and measuring 1. This information may be used in any of the systems and methods described herein for performing battery evaluation calculations.

Figure 5:
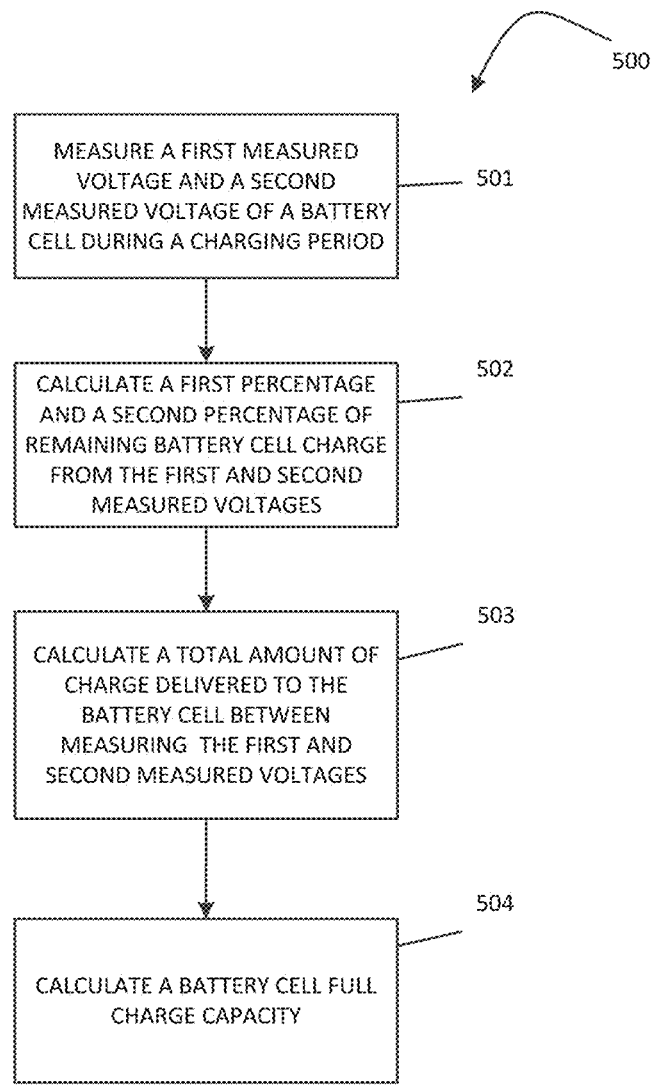
FIG. 5 is a flow chart of a method for calculating a battery cell full-charge capacity according to one embodiment.

FIG. 5 is a flow chart of a method 500 for calculating a battery cell full-charge capacity. The method 500 comprises measure 501 a first measured voltage and a second measured voltage of a battery cell during a charging period, calculate 502 a first percentage and second percentage of remaining battery cell charge from the first and second measured voltages, calculate 503 a total amount of charge delivered to the battery cell between measuring the first and second measured voltages, and calculate 504 a battery cell full-charge capacity. The method 500 may be performed using any one of the systems described herein or any combination of systems described herein. The steps involving a calculation may comprise a manipulation of data. The term "calculate" may also comprise converting electronic data to another form of electronic data or performing a measurement.

Figure 6:
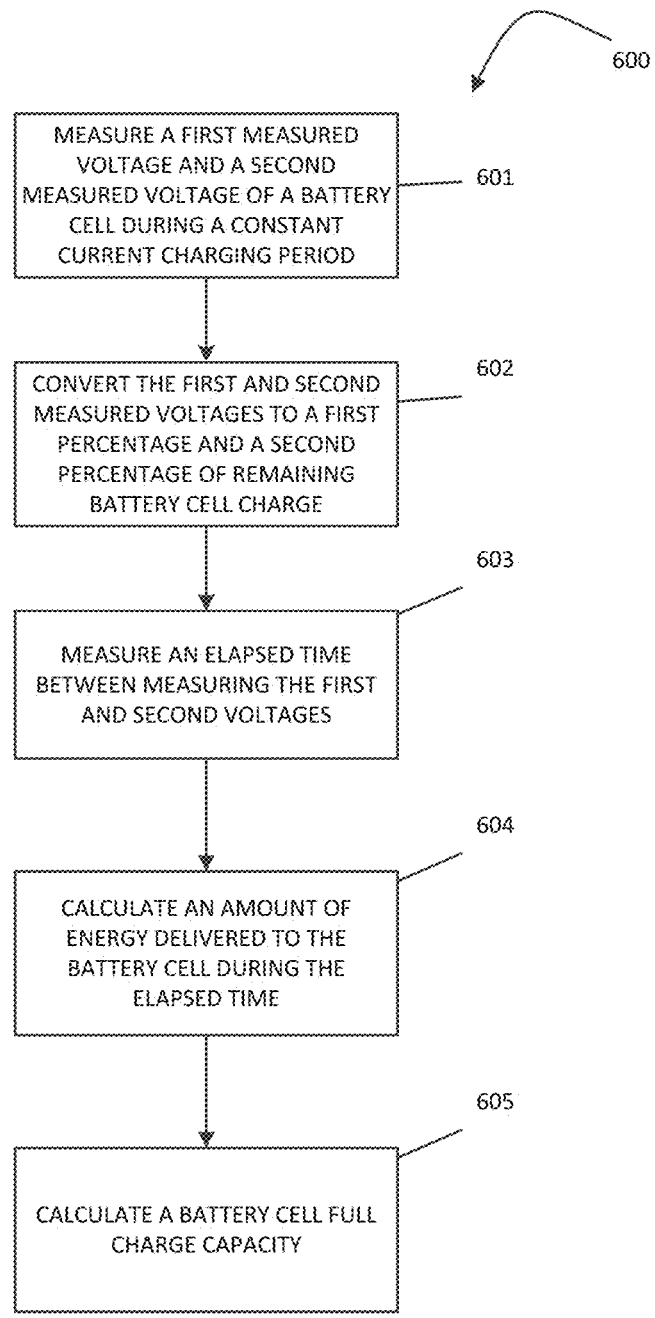
FIG. 6 is a flow chart of a method for calculating a battery cell full-charge capacity according to one embodiment.

FIG. 6 is a flow chart of a method 600 for calculating a battery cell full-charge capacity. The method 600 comprises measure 601 a first measured voltage and a second measured voltage of a battery cell during a constant current charging period, convert 602 the first and second measured voltages to a first percentage and a second percentage of remaining battery cell charge, measure 603 an elapsed time between measuring the first and second voltages, calculate 604 an amount of energy delivered to the battery cell during the elapsed time, and calculate 605 a battery cell full-charge capacity. The method 600 may be performed using any one of the systems described herein or any combination of systems described herein. The steps involving a calculation may comprise a manipulation of data. The term "calculate" may also comprise converting electronic data to another form of electronic data or performing a measurement.

Figure 7:
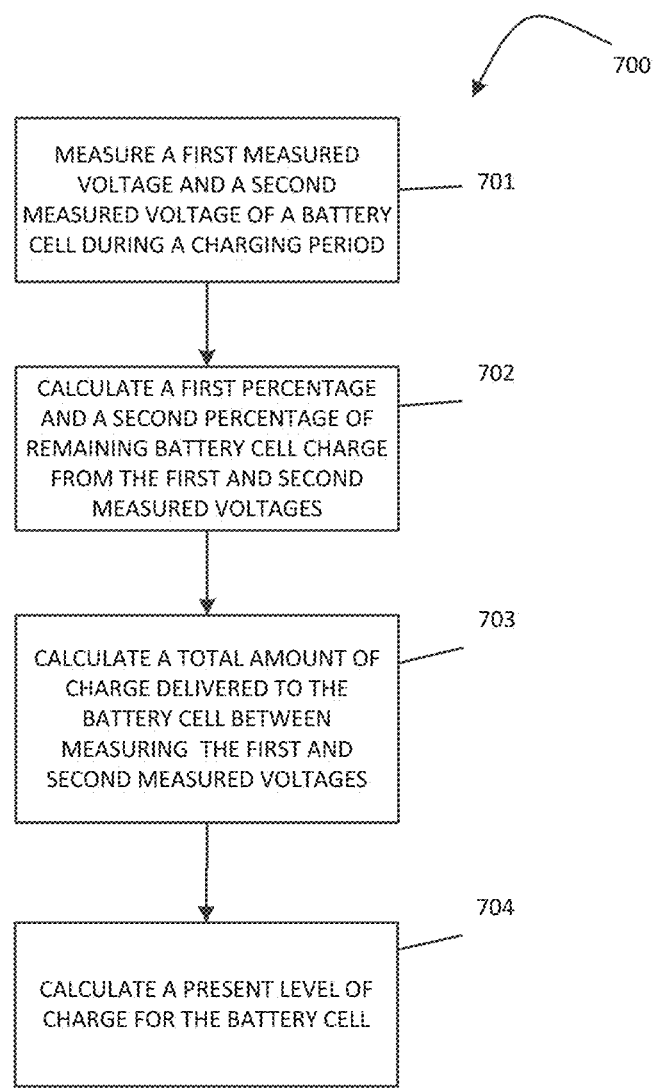
FIG. 7 is a flow chart of a method for calculating a present level of charge for a battery cell according to one embodiment.

FIG. 7 is a flow chart of a method 700 for calculating a present level of charge for a battery cell. The method 700 comprises measure 701 a first measured voltage and a second measured voltage of a battery cell during a charging period, calculate 702 a first percentage and a second percentage of remaining battery cell charge from the first and second measured voltages, calculate 703 a total amount of charge delivered to the battery cell between measuring the first and second measured voltages, and calculate 704 a present level of charge for the battery cell. The steps involving a calculation may comprise a manipulation of data. The term "calculate" may also comprise converting electronic data to another form of electronic data or performing a measurement.

Figure 8:
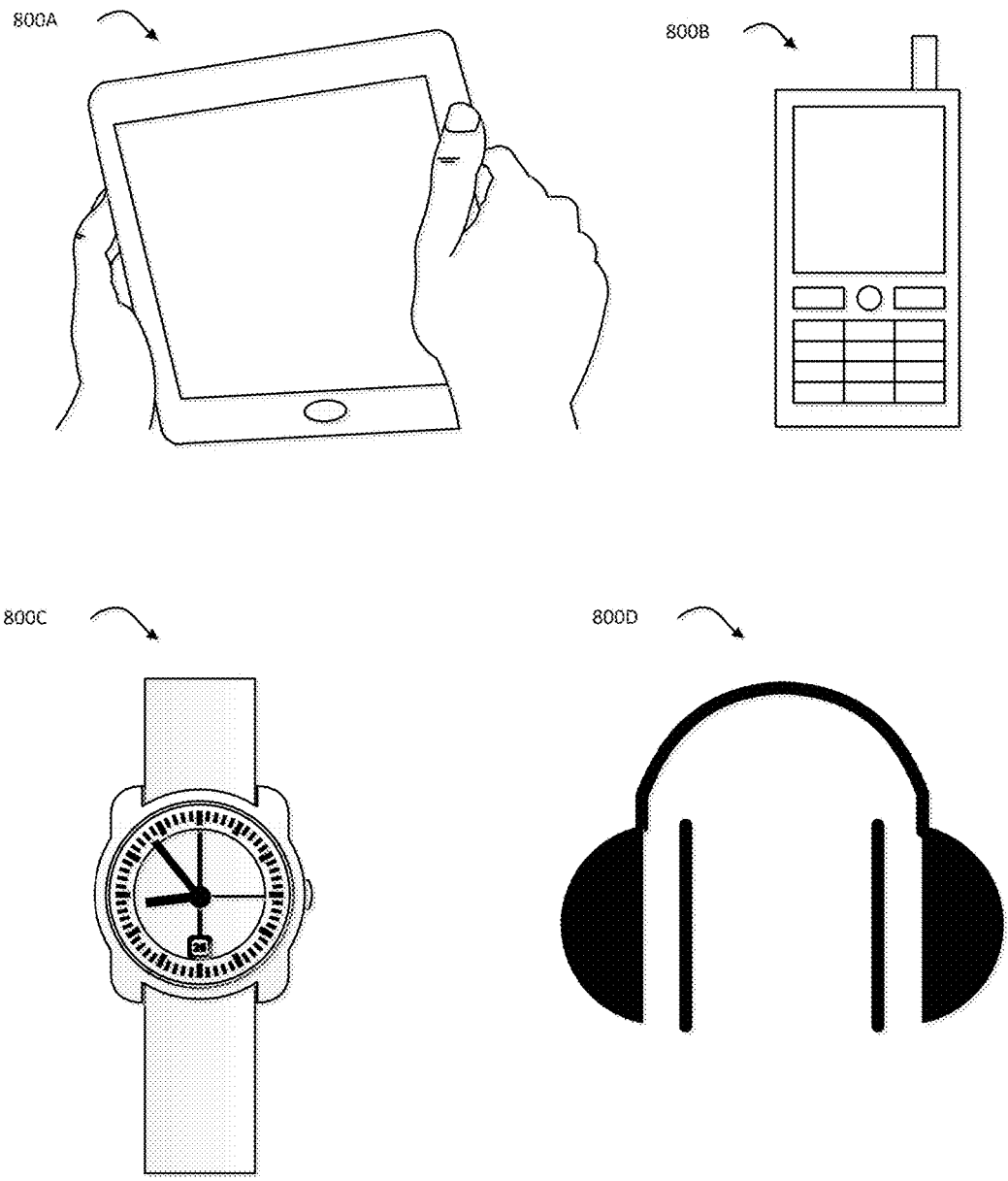
FIG. 8 illustrates examples of electronic devices in which a system for battery cell capacity estimation may be used.

FIG. 8 illustrates examples of electronic devices 800A, 800B, 800C, and 880D in which a system for battery cell capacity estimation may be used. Electronic device 800A represents a computer tablet computing device. Electronic device 800B represents a mobile telephone. Electronic device 800C represents a watch. Electronic device 800D represents an audio listening device such as headphones. Electronic devices 800A, 800B, 800C, 800D may be equipped with one or more of a display element and a speaker. A display and/or speaker may be configured to communicate battery evaluation calculations to a user or third party. In some embodiments, electronic devices 800A, 800B, 800C, 800D may be wearable by a user.

The above methods may be manipulated to perform any of the battery evaluation calculations described herein. Additionally, the above methods may be adjusted to perform battery evaluation calculations during a discharging period as described herein.

Example Embodiments

The following are examples of further embodiments. Examples may include subject matter such as a battery, a device, a method, a means for performing acts of the method, or at least one machine-readable medium including instructions that, when performed by a machine, cause the machine to perform acts of the method according to the embodiments and examples described herein.

Example 1 is a system for calculating a full-charge battery cell capacity. The system includes a charging input to convey an electrical current to convey charge to a battery cell during charging period. A measurement device is used to measure a first and a second voltage reading of the battery cell that are then stored in a data store. At least one processor is included in the system to estimate a full-charge battery cell capacity using information gathered and stored on the data store. To perform the estimation, at least one processor accesses the two voltage readings stored in the data store and uses a conversion data file to convert the two voltage readings into two percentages of remaining battery cell charge. The two percentages are compared to determine an increase in percentage of remaining battery cell charge. At least one processor is also used to calculate an amount of charge received by the battery cell between measuring the first and the second voltage readings. At least one processor then uses the above calculations in another calculation to derive an estimate of the full-charge battery cell capacity.

Example 2 includes the system of Example 1, further including a timer to measure an elapsed time between measuring the first and the second voltage readings.

Example 3 includes the system of Example 2, where calculating the amount of charge received by the battery cell between measuring the first and the second voltage readings includes multiplying an average of the electrical current conveyed to the battery cell during the elapsed time by the amount of elapsed time.

Example 4 includes the system of Example 1, where the charging input conveys to the battery cell a constant electrical current during the charging period.

Example 5 includes the system of Example 4, where the measurement device measures the first measured voltage and the second measured voltage during the charging period.

Example 6 includes the system of Example 1, where the conversion data file includes one or more of a conversion table and a mathematical formula for calculating a percentage of remaining battery cell charge from a measured voltage.

Example 7 includes the system of Example 1, where at least one processor delivers a command to a charger integrated circuit to reduce the electrical current conveyed by the charging input to the battery cell in response to a calculated level of degradation of the battery cell. The level of degradation of the battery cell is calculated as the estimate of full-charge battery cell capacity divided by an original full-charge battery cell capacity.

Example 8 includes the system of any of Examples 1-7, where the electrical current conveyed by the charging input to the battery cell is temporarily stopped a first time for the measurement device to measure the first measured voltage, and a second time for the measurement device to measure the second measured voltage.

Example 9 includes the system of any of Examples 1-7, where the measurement device measures the first measured voltage and the second measured voltage while the charging input conveys the electrical current to the battery cell, and where the conversion data file accounts for the change in the voltage of the battery cell induced by the electrical current.

Example 10 includes the system of any of Examples 1-7, where the battery cell, the charging input, the measurement device, the data store, the conversion data file, and at least one processor are contained in a wearable device.

Example 11 includes the system of any of Examples 1-7, where estimating further includes averaging at least two derived estimates of the full-charge battery cell capacity to calculate an improved estimate of the full-charge battery cell capacity.

Example 12 is a wearable electronic device. The wearable electronic device includes a battery cell that may be used to provide electrical energy to the wearable electronic device. Also included is a charging input to receive charge via charge current to the battery cell during a charging period. A charger integrated circuit measures the charge current and limits the charge current to a constant amount. The wearable electronic device also includes a battery management chip to measure a first and a second measured voltage of the battery cell that are then stored in a data store. A timer is included in the wearable electronic device to measure an amount of time elapsed between measuring the first and the second measured voltage which is also stored in the data store. The wearable electronic device further includes a conversion data file for converting a measured voltage to a percentage of remaining battery cell charge. A processor is used to access the two voltage readings stored in the data store and use the conversion data file to convert the two voltage readings into two percentages of remaining battery cell charge. The two percentages are compared to determine an increase in percentage of remaining battery cell charge. The processor calculate an amount of charge provided by a power source to the battery cell between measuring of the first measured voltage and the second measured voltage, by multiplying the time elapsed by the measured current received. The processor then uses the above calculations in another calculation to derive an estimate of the full-charge battery cell capacity.

Example 13 includes the wearable electronic device of Example 12, where the processor also calculates a present level of charge stored in the battery cell as: (a present percentage)/((the second percentage)−(the first percentage))×(the elapsed time)×(the average charge current).

Example 14 includes the wearable electronic device of Example 13, where the processor also calculates an amount of time remaining to fully discharge the battery cell as: (remaining amount of time)=(the present level of charge stored in the battery cell)/(a measured discharge current).

Example 15 includes the wearable electronic device of Example 14, also including a display for displaying at least the estimated remaining amount of time to fully discharge the battery cell.

Example 16 is a computer-readable storage medium including instructions for execution by a processor that, when executed, cause the processor to perform operations. One operation includes measuring a first measured voltage of a battery cell and a second measured voltage of the battery cell during a charging period. Another operation includes calculating a first percentage of remaining battery cell charge (P1) corresponding to the first measured voltage and calculating a second percentage of remaining battery cell charge (P2) corresponding to the second measured voltage. Another operation includes calculating an elapsed time (T) between measuring the first measured voltage and measuring the second measured voltage. An additional operation includes calculating an average charge current (I) during the elapsed time from measuring the first measured voltage to measuring the second measured voltage. Using the above described operations, the processor may perform an operation of calculating an estimated full-charge battery cell capacity (C) using an equation including: C=100/(P2−P1)×T×I.

Example 17 includes the computer-readable storage medium of Example 16, where the charge current is constant between measuring the first measured voltage and measuring the second measured voltage.

Example 18 includes the computer-readable storage medium of Example 17, further including an operation of decreasing the charge current proportionally with a calculated degradation of the battery cell. The degradation of the battery cell is calculated as the estimated full-charge battery cell capacity divided by an original full-charge battery cell capacity.

Example 19 includes the computer-readable storage medium of any of Examples 16-18, further including estimating a remaining amount of time to charge the battery cell to a specified percentage of charge capacity as: (time remaining)=(the specified percentage of charge capacity−(the second percentage))/((the second percentage)−(the first percentage))×(the elapsed time).

Example 20 includes the computer-readable storage medium of any of Examples 16-18, further including an operation of calculating a present level of charge stored in the battery cell as: (the present level of charge)=(a present percentage)/((the second percentage)−(the first percentage))×(the elapsed time)×(the average charge current).

Example 21 includes the computer-readable storage medium of Example 20, further including an operation of estimating a remaining amount of time to fully discharge the battery cell as: (the remaining amount of time)=(the present level of charge stored in the battery cell)/(a predicted discharge rate).

Example 22 includes the computer-readable storage medium of any of Examples 16-18, further including an operation of averaging a plurality of estimates of battery cell full-charge capacity to calculate an improved estimate of the full-charge battery cell capacity.

Example 23 is a method for calculating an estimated full-charge battery cell capacity. The method includes measuring a first measured voltage of a battery cell and a second measured voltage of the battery cell during a discharging period. A first percentage of remaining battery cell charge corresponding to the first measured voltage and calculating a second percentage of remaining battery cell charge corresponding to the second measured voltage are calculated. The method further includes calculating an elapsed time between measuring the first measured voltage and measuring the second measured voltage. Additionally, the method includes calculating an average discharge electrical current during the elapsed time from measuring the first measured voltage to measuring the second measured voltage. The method also includes calculating an estimated full-charge battery cell capacity as: (full-charge capacity)=100/((the first percentage)−(the second percentage))×(the elapsed time)×(the average discharge electrical current).

Example 24 includes the method of Example 23, where the discharge electrical current is constant between measuring the first measured voltage and measuring the second measured voltage.

Example 25 includes the method of Example 23, further including calculating a present level of charge stored in the battery cell as: (a present percentage)/((the first percentage)−(the second percentage))×(the elapsed time)×(the average discharge electrical current).

Example 26 includes the method of Example 23, further including a timer to measure the elapsed time between measuring the first measured voltage and measuring the second measured voltage.

Example 27 includes the method of Example 26, where calculating an amount of charge delivered by the battery cell between measuring of the first measured voltage and the second measured voltage includes multiplying an average of the discharge electrical current discharged by the elapsed time.

Example 28 includes the method of Example 23, where a measurement device measures the first measured voltage and the second measured voltage during the discharging period.

Example 29 includes the method of Example 23, where calculating the first percentage of remaining battery cell charge and calculating the second percentage of remaining battery cell charge includes accessing a conversion data file including one or more of a conversion table and a mathematical formula for calculating a percentage of remaining battery cell charge from a measured voltage.

Example 30 includes the method of Example 23, further including delivering a command to reduce a maximum electrical current conveyed to the battery cell during charging in response to a calculated level of degradation of the battery cell, the level of degradation of the battery cell being calculated as the estimate of the full-charge battery cell capacity divided by an original full-charge battery cell capacity.

Example 31 includes the method of Example 23, where the discharge electrical current is temporarily stopped a first time to measure the first measured voltage, and the discharge electrical current is temporarily stopped a second time to measure the second measured voltage.

Example 32 includes the method of Example 23, where measurements of the first measured voltage and the second measured voltage are performed while the battery cell discharges electrical current, and where calculating a first percentage of remaining battery cell charge and calculating a second percentage of remaining battery cell charge accounts for a voltage of the battery cell induced by the discharge electrical current.

Example 33 includes the method of Example 23, further including averaging a plurality of derived estimates of the full-charge battery cell capacity to calculate an improved estimate of the full-charge battery cell capacity.

Example 34 includes the method of Example 23, further including estimating a remaining amount of time to charge the battery cell to a specified percentage of charge capacity as: (time remaining)=(the specified percentage of charge capacity−(the second percentage))/((the first percentage)−(the second percentage))×(the elapsed time).

Example 35 includes the method of Example 23, further including calculating a present level of charge stored in the battery cell as: (the present level of charge)=(a present percentage)/((the first percentage)−(the second percentage))×(the elapsed time)×(the average discharge electrical current).

Example 36 includes the method of Example 35, further including estimating a remaining amount of time to fully discharge the battery cell as: (the remaining amount of time)=(the present level of charge stored in the battery cell)/(a predicted discharge rate).

Example 37 includes machine-readable storage including machine-readable instructions, when executed, to implement a method as described in any of Examples 23-36.

Example 38 includes means for implementing a method as described in any of Examples 23-36.

Example 39 is a method for calculating an estimated full-charge battery cell capacity. The method includes measuring a first measured voltage of a battery cell and a second measured voltage of the battery cell during a charging period. A first percentage of remaining battery cell charge corresponding to the first measured voltage and calculating a second percentage of remaining battery cell charge corresponding to the second measured voltage are calculated. The method further includes calculating an elapsed time between measuring the first measured voltage and measuring the second measured voltage. Additionally, the method includes calculating an average charging electrical current during the elapsed time from measuring the first measured voltage to measuring the second measured voltage. The method also includes calculating an estimated full-charge battery cell capacity as: (full-charge capacity)=100/((the second percentage)−(the first percentage))×(the elapsed time)×(the average charge electrical current).

Example 40 includes the method of Example 39, where the charging electrical current is constant between measuring the first measured voltage and measuring the second measured voltage.

Example 41 includes the method of Example 39, further including calculating a present level of charge stored in the battery cell as: (a present percentage)/((the second percentage)−(the first percentage))×(the elapsed time)×(the average charging electrical current).

Example 42 includes the method of Example 39, further including a timer to measure the elapsed time between measuring the first measured voltage and measuring the second measured voltage.

Example 43 includes the method of Example 42, where calculating an amount of charge delivered to the battery cell between measuring of the first measured voltage and the second measured voltage includes multiplying an average of the charging electrical current by the elapsed time.

Example 44 includes the method of Example 39, where a measurement device measures the first measured voltage and the second measured voltage during the charging period.

Example 45 includes the method of Example 39, where calculating the first percentage of remaining battery cell charge and calculating the second percentage of remaining battery cell charge includes accessing a conversion data file including one or more of a conversion table and a mathematical formula for calculating a percentage of remaining battery cell charge from a measured voltage.

Example 46 includes the method of Example 39, further including delivering a command to reduce a maximum charging electrical current in response to a calculated level of degradation of the battery cell, the level of degradation of the battery cell being calculated as the estimate of the full-charge battery cell capacity divided by an original full-charge battery cell capacity.

Example 47 includes the method of Example 39, where the charging electrical current is temporarily stopped a first time to measure the first measured voltage, and the charging electrical current is temporarily stopped a second time to measure the second measured voltage.

Example 48 includes the method of Example 39, where measurements of the first measured voltage and the second measured voltage are performed while the charging current is delivered to the battery cell, and where calculating a first percentage of remaining battery cell charge and calculating a second percentage of remaining battery cell charge accounts for a voltage of the battery cell induced by the charging electrical current.

Example 49 includes the method of Example 39, further including averaging a plurality of derived estimates of the full-charge battery cell capacity to calculate an improved estimate of the full-charge battery cell capacity.

Example 50 includes the method of Example 39, further including estimating a remaining amount of time to charge the battery cell to a specified percentage of charge capacity as: (time remaining)=(the specified percentage of charge capacity−(the second percentage))/((the second percentage)−(the first percentage))×(the elapsed time).

Example 51 includes the method of Example 39, further including calculating a present level of charge stored in the battery cell as: (the present level of charge)=(a present percentage)/((the second percentage)−(the first percentage))×(the elapsed time)×(the average charging electrical current).

Example 52 includes the method of Example 39, further including estimating a remaining amount of time to fully discharge the battery cell as: (the remaining amount of time)=(the present level of charge stored in the battery cell)/(a predicted discharge rate).

Example 53 includes machine-readable storage including machine-readable instructions, when executed, to implement a method as described in any of Examples 39-52.

Example 54 includes means for implementing a method as described in any of Examples 39-52.

Example 55 is a system for calculating a full-charge battery cell capacity. The system includes a discharging output to convey a discharging electrical current to supply charge from a battery cell to a device during a discharging period. A measurement device is used to measure a first and a second voltage reading of the battery cell that are then stored in a data store. At least one processor is included in the system to estimate a full-charge battery cell capacity using information gathered and stored on the data store. To perform the estimation, at least one processor accesses the two voltage readings stored in the data store and uses a conversion data file to convert the two voltage readings into two percentages of remaining battery cell charge. The two percentages are compared to determine a decrease in percentage of remaining battery cell charge. At least one processor is also used to calculate an amount of charge discharged by the battery cell between measuring of the first measured voltage and the second measured voltage. At least one processor then uses the above calculations in another calculation to derive an estimate of the full-charge battery cell capacity.

Example 56 includes the system of Example 55, further including a timer to measure an elapsed time including an amount of time elapsed between measuring the first measured voltage and the second measured voltage.

Example 57 includes the system of Example 55, where calculating an amount of charge discharged by the battery cell between measuring of the first measured voltage and the second measured voltage includes multiplying an average of the electrical current conveyed to the battery cell by the elapsed time.

Example 58 includes the system of Example 55, where the discharging output conveys a constant electrical current during the discharging period.

Example 59 includes the system of Example 55, where the measurement device measures the first measured voltage and the second measured voltage during the discharging period.

Example 60 includes the system of Example 55, where the conversion data file includes one or more of a conversion table and a mathematical formula for calculating a percentage of remaining battery cell charge from a measured voltage.

Example 61 includes the system of Example 55, where the at least one processor delivers a command to a charger integrated circuit to reduce a charging electrical current delivered to the battery cell in response to a calculated level of degradation of the battery cell, the level of degradation of the battery cell being calculated as the estimate of the full-charge battery cell capacity divided by an original full-charge battery cell capacity.

Example 62 includes the system of any of Examples 55-61, where the discharging electrical current is temporarily stopped a first time for the measurement device to measure the first measured voltage, and the discharging electrical current is temporarily stopped a second time for the measurement device to measure the second measured voltage.

Example 63 includes the system of any of Examples 55-61, where the measurement device measures the first measured voltage and the second measured voltage while the discharging electrical current is output from the battery cell, and where the conversion data file accounts for the change in the voltage of the battery cell induced by the discharging electrical current.

Example 64 includes the system of any of Examples 55-61, where the battery cell, the discharging output, the measurement device, the data store, the conversion data file, and at least one of the at least one processor are included in a wearable device.

Example 65 includes the system of any of Examples 55-61, where estimating further includes averaging a plurality of derived estimates of the full-charge battery cell capacity to calculate an improved estimate of the full-charge battery cell capacity.

Example 66 is a wearable electronic device. The wearable electronic device includes a battery cell that may be used to provide electrical energy to the wearable electronic device. Also included is a discharging output to convey charge from the battery cell to a device as a discharging current during a discharging period. A charger integrated circuit measures the charge current and limits the charge current to a constant amount. The wearable electronic device also includes a battery management chip to measure a first and a second measured voltage of the battery cell that are then stored in a data store. A timer is included in the wearable electronic device to measure an amount of time elapsed between measuring the first and the second measured voltage which is also stored in the data store. The wearable electronic device further includes a conversion data file for converting a measured voltage to a percentage of remaining battery cell charge. A processor is used to access the two voltage readings stored in the data store and use the conversion data file to convert the two voltage readings into two percentages of remaining battery cell charge. The two percentages are compared to determine a decrease in percentage of remaining battery cell charge. The processor also accessed the time elapsed in the data store to calculate an amount of charge provided from the battery cell to the device between measuring of the first measured voltage and the second measured voltage, by multiplying the time elapsed by the measured discharging current. The processor then uses the above calculations in another calculation to derive an estimate of the full-charge battery cell capacity.

Example 67 includes the wearable electronic device of Example 66, where the processor also calculates a present level of charge stored in the battery cell as: (a present percentage)/((the first percentage)−(the second percentage))×(the elapsed time)×(the average discharge current).

Example 68 includes the wearable electronic device of Example 67, where the processor also calculates an amount of time remaining to fully discharge the battery cell as: (remaining amount of time)=(the present level of charge stored in the battery cell)/(the measured discharge current).

Example 69 includes the wearable electronic device of Example 68, further including a display for displaying at least the estimated remaining amount of time to fully discharge the battery cell.

Various embodiments may be implemented using hardware elements, software elements, and/or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

One or more aspects of at least one embodiment may be implemented by representative instructions stored on a machine-readable medium which represents various logic within the processor, which when read by a machine causes the machine to fabricate logic to perform the techniques described herein. A machine-readable medium may include, for example, static random access memory (RAM), dynamic RAM, flash memory, one or more flip-flops, read only memory (ROM), compact disc ROM (CD-ROM), digital versatile disk (DVD), magnetic disk, magnetic tape, or other magnetic, optical, or solid state computer storage medium.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings, and the appended claims. In addition to variations and modifications in the component parts and/or arrangements, alternative uses will also be apparent to those skilled in the art. The scope of the present invention should, therefore, be determined only by the following claims.

The invention claimed is:

1. A system comprising:
a charging input to convey an electrical current to supply charge to a battery cell during a charging period;
a measurement device to measure a first measured voltage of the battery cell and a second measured voltage of the battery cell;
a data store for storing the first measured voltage and the second measured voltage; and
at least one processor to estimate a full-charge battery cell capacity without a coulomb counter and control the electrical current based on the estimate of the full-charge battery cell capacity, wherein the processor is to:
access the first measured voltage and the second measured voltage from the data store;
access a conversion data file comprising data to convert a measured voltage to a percentage of remaining battery cell charge;
convert the first measured voltage to a first percentage and convert the second measured voltage to a second percentage based on a predetermined characterization of the battery cell;
compare the first percentage and the second percentage to determine an increase in percentage of remaining battery cell charge;
calculate an amount of charge received by the battery cell between measuring of the first measured voltage and the second measured voltage;
derive an estimate of the full-charge battery cell capacity from the amount of charge received by the battery cell and the increase in percentage of remaining battery cell charge;
determine a battery degradation between an original full-charge battery cell capacity and the estimate of the full-charge battery cell capacity; and
reduce, via the charging input, the electrical current conveyed to the battery cell based on the battery degradation.

2. The system of claim 1, further comprising a timer to measure a measured time comprising an amount of time elapsed between measuring the first measured voltage and the second measured voltage.

3. The system of claim 2, wherein calculating an amount of charge received by the battery cell between measuring of the first measured voltage and the second measured voltage comprises multiplying an average of the electrical current conveyed to the battery cell by the measured time.

4. The system of claim 1, wherein the charging input conveys to the battery cell a constant electrical current during the charging period.

5. The system of claim 4, wherein the measurement device measures the first measured voltage and the second measured voltage during the charging period.

6. The system of claim 1, wherein the conversion data file comprises one or more of a conversion table and a mathematical formula for calculating a percentage of remaining battery cell charge from a measured voltage.

7. The system of claim 1, wherein the at least one processor delivers a command to a charger integrated circuit to reduce the electrical current conveyed by the charging input to the battery cell in response to a calculated level of degradation of the battery cell, the level of degradation of the battery cell being calculated as the estimate of the full-charge battery cell capacity divided by an original full-charge battery cell capacity.

8. The system of claim 1, wherein the electrical current conveyed by the charging input to the battery cell is temporarily stopped a first time for the measurement device to measure the first measured voltage, and the electrical current conveyed by the charging input to the battery cell is temporarily stopped a second time for the measurement device to measure the second measured voltage.

9. The system of claim 1, wherein the measurement device measures the first measured voltage and the second measured voltage while the charging input conveys the electrical current to the battery cell, and wherein the conversion data file accounts for the change in the voltage of the battery cell induced by the electrical current.

10. The system of claim 1, wherein the battery cell, the charging input, the measurement device, the data store, the conversion data file, and at least one of the at least one processor are comprised in a wearable device.

11. The system of claim 1, wherein estimating further comprises averaging a plurality of derived estimates of the full-charge battery cell capacity to calculate an improved estimate of the full-charge battery cell capacity.

12. A wearable electronic device comprising:
a battery cell;
a charging input to receive charge via a charge current to the battery cell during a charging period;
a charger integrated circuit to measure the current received by the charging input and limit the charge current to a constant amount;
a battery management chip to measure a first measured voltage of the battery cell and a second measured voltage of the battery cell;
a timer to measure a time elapsed between measuring the first measured voltage and the second measured voltage;
a data store for storing the first measured voltage, the second measured voltage, and the time elapsed between measuring of the first measured voltage and the second measured voltage;
a conversion data file to convert a measured voltage to a percentage of remaining battery cell charge; and
a processor to estimate a full-charge battery cell capacity and modify the electrical current based on the full-charge battery cell capacity, wherein the processor is to:
access the first measured voltage, the second measured voltage, and the time elapsed from the data store;
access the conversion data file;
convert the first measured voltage to a first percentage and convert the second measured voltage to a second percentage by using the conversion data file;
compare the first percentage and the second percentage to determine an increase in percentage of remaining battery cell charge;
calculate an amount of charge provided by a power source to the battery cell between measuring of the first measured voltage and the second measured voltage, by multiplying the time elapsed by the measured current received;
derive an estimate of the full-charge battery cell capacity from the amount of charge provided by the power source to the battery cell and the increase in percentage of remaining battery cell charge;
calculate a battery degradation between an original full-charge battery cell capacity and the estimate of the full-charge battery cell capacity; and modify, via the charger integrated circuit, the electrical current conveyed by the charging input to the battery cell based on the calculated battery degradation.

13. The wearable electronic device of claim 12, wherein the processor further calculates a present level of charge stored in the battery cell as: (a present percentage)/((the second percentage)−(the first percentage))×(the elapsed time)×(the average charge current).

14. The wearable electronic device of claim 13, wherein the processor further calculates an amount of time remaining to fully discharge the battery cell as: (remaining amount of time)=(the present level of charge stored in the battery cell)/(a measured discharge current).

15. The wearable electronic device of claim 14, further comprising a display for displaying at least the estimated remaining amount of time to fully discharge the battery cell.

16. A non-transitory computer-readable storage medium comprising instructions for execution by a processor, execution of the instructions to cause the processor to perform operations comprising:
measuring a first measured voltage of a battery cell and a second measured voltage of the battery cell during a charging period;
calculating a first percentage of remaining battery cell charge ($P_1$) corresponding to the first measured voltage and calculating a second percentage of remaining battery cell charge ($P_2$) corresponding to the second measured voltage;
calculating an elapsed time (T) between measuring the first measured voltage and measuring the second measured voltage;
calculating an average charge current (I) during the elapsed time from measuring the first measured voltage to measuring the second measured voltage;
calculating an estimated full-charge battery cell capacity (C) using an equation comprising: $C=100/(P_2-P_1)\times T\times I$; and
modifying an electrical current conveyed to the battery cell for charging based on the estimate of the full-charge battery cell capacity.

17. The non-transitory computer-readable storage medium of claim 16, wherein the charge current is constant between measuring the first measured voltage and measuring the second measured voltage.

18. The non-transitory computer-readable storage medium of claim 17, further comprising an operation comprising decreasing the charge current proportionally with the calculated degradation of the battery cell, wherein the degradation of the battery cell is calculated as the estimated full-charge battery cell capacity divided by the original full-charge battery cell capacity.

19. The non-transitory computer-readable storage medium of claim 16, further comprising an operation comprising estimating a remaining amount of time to charge the battery cell to a specified percentage of charge capacity as: (time remaining)=(the specified percentage of charge capacity−(the second percentage))/((the second percentage)−(the first percentage))×(the elapsed time).

20. The non-transitory computer-readable storage medium of claim 16, further comprising an operation comprising calculating a present level of charge stored in the battery cell as: (the present level of charge)=(a present percentage)/((the second percentage)−(the first percentage))×(the elapsed time)×(the average charge current).

21. The non-transitory computer-readable storage medium of claim 20, further comprising an operation comprising estimating a remaining amount of time to fully discharge the battery cell as: (the remaining amount of time)=(the present level of charge stored in the battery cell)/(a predicted discharge rate).

22. The non-transitory computer-readable storage medium of claim 16, further comprising an operation comprising averaging a plurality of estimates of battery cell full-charge capacity to calculate an improved estimate of the full-charge battery cell capacity.

23. A computer-implemented method comprising:
measuring a first measured voltage of a battery cell and a second measured voltage of the battery cell during a discharging period;
calculating a first percentage of remaining battery cell charge corresponding to the first measured voltage and calculating a second percentage of remaining battery cell charge corresponding to the second measured voltage;
calculating an elapsed time between measuring the first measured voltage and measuring the second measured voltage;
calculating an average discharge electrical current during the elapsed time from measuring the first measured voltage to measuring the second measured voltage;
calculating an estimated full-charge battery cell capacity as: (full-charge capacity)=100/((the first percentage)−(the second percentage))×(the elapsed time)×(the average discharge electrical current);
calculating a battery degradation between an original full-charge battery cell capacity and the estimate of the full-charge battery cell capacity; and
modifying an electrical current conveyed to the battery cell for charging based on the calculated battery degradation.

24. The computer-implemented method of claim 23, wherein the discharge electrical current is constant between measuring the first measured voltage and measuring the second measured voltage.

25. The computer-implemented method of claim 23, further comprising calculating a present level of charge stored in the battery cell as: (a present percentage)/((the first percentage)−(the second percentage))×(the elapsed time)×(the average discharge electrical current).

* * * * *